(12) United States Patent
Edelstein et al.

(10) Patent No.: US 7,928,569 B2
(45) Date of Patent: Apr. 19, 2011

(54) REDUNDANT BARRIER STRUCTURE FOR INTERCONNECT AND WIRING APPLICATIONS, DESIGN STRUCTURE AND METHOD OF MANUFACTURE

(75) Inventors: Daniel C. Edelstein, White Plains, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 195 days.

(21) Appl. No.: 12/191,543

(22) Filed: Aug. 14, 2008

(65) Prior Publication Data

US 2010/0038784 A1     Feb. 18, 2010

(51) Int. Cl.
  *H01L 21/44* (2006.01)
  *H01L 23/48* (2006.01)
  *H01L 23/52* (2006.01)
  *G06F 9/45* (2006.01)

(52) U.S. Cl. ........... 257/751; 257/E23.01; 257/E21.476; 257/774; 257/680; 257/700; 257/701; 257/758; 257/762; 257/765; 257/763

(58) Field of Classification Search .......... 257/751, 257/E23.01, 774, 680, 700, 701, 758, 762, 257/765, 763, E21.476; 438/653; 716/5
See application file for complete search history.

(56) References Cited

U.S. PATENT DOCUMENTS

| | | | |
|---|---|---|---|
| 5,221,449 A | 6/1993 | Colgan et al. | |
| 5,281,485 A | 1/1994 | Colgan et al. | |
| 5,930,669 A | 7/1999 | Uzoh | |
| 6,037,256 A | 3/2000 | Weinrich et al. | |
| 6,291,885 B1 | 9/2001 | Cabral, Jr. et al. | |
| 6,429,519 B1 | 8/2002 | Uzoh | |
| 6,437,440 B1 | 8/2002 | Cabral, Jr. et al. | |
| 6,699,769 B2 | 3/2004 | Song et al. | |
| 6,844,261 B2 | 1/2005 | Marsh et al. | |
| 6,861,355 B2 | 3/2005 | Marsh | |
| 6,927,143 B2* | 8/2005 | Lee | 438/397 |
| 7,348,648 B2* | 3/2008 | Yang et al. | 257/428 |
| 7,663,239 B2* | 2/2010 | Ikeda et al. | 257/751 |
| 2002/0084529 A1* | 7/2002 | Dubin et al. | 257/774 |
| 2004/0108217 A1* | 6/2004 | Dubin | 205/291 |
| 2005/0146034 A1* | 7/2005 | Andreyushchenko et al. | 257/751 |
| 2005/0206000 A1* | 9/2005 | Aggarwal et al. | 257/758 |
| 2005/0263891 A1* | 12/2005 | Lee et al. | 257/751 |

(Continued)

OTHER PUBLICATIONS

J. Ekerdt, et al.; "Chemical Vapor Deposition of Amorphous Ruthenium-Phosphorus Alloy Films for Cu Interconnect Applications"; Conference Proceedings AMC XXIII copy right 2008 Materials Research Society; pp. 179-185.

*Primary Examiner* — Alexander O Williams
(74) *Attorney, Agent, or Firm* — Katherine S. Brown; Roberts Mlotkowski Safran & Cole, P.C.

(57) ABSTRACT

A redundant diffusion barrier structure and method of fabricated is provided for interconnect and wiring applications. The structure can also be a design structure. The structure includes a first liner lining at least one of a trench and a via and a second liner deposited over the first liner. The second liner comprises RuX. X is at least one of Boron and Phosphorous. The structure comprises a metal deposited on the second liner in the at least one trench and via to form a metal interconnect or wiring.

16 Claims, 7 Drawing Sheets

U.S. PATENT DOCUMENTS

| | | | |
|---|---|---|---|
| 2006/0046453 A1* | 3/2006 | Collins et al. | 438/597 |
| 2008/0054464 A1* | 3/2008 | Ikeda et al. | 257/751 |
| 2008/0054472 A1* | 3/2008 | Shinriki et al. | 257/762 |
| 2008/0261412 A1* | 10/2008 | Yoon et al. | 438/785 |
| 2008/0296768 A1* | 12/2008 | Chebiam et al. | 257/751 |
| 2008/0315426 A1* | 12/2008 | Yang et al. | 257/769 |
| 2009/0014878 A1* | 1/2009 | Cabral et al. | 257/751 |
| 2009/0022958 A1* | 1/2009 | Plombon et al. | 428/164 |
| 2009/0087339 A1* | 4/2009 | Shinriki | 420/462 |
| 2009/0087982 A1* | 4/2009 | Wang et al. | 438/653 |
| 2009/0155997 A1* | 6/2009 | Shinriki et al. | 438/653 |
| 2010/0032829 A1* | 2/2010 | Anderson et al. | 257/737 |
| 2010/0059893 A1* | 3/2010 | Chang et al. | 257/761 |

* cited by examiner

REDUNDANT BARRIER STRUCTURE FOR INTERCONNECT AND WIRING APPLICATIONS, DESIGN STRUCTURE AND METHOD OF MANUFACTURE

FIELD OF THE INVENTION

The present invention relates to integrated circuits (ICs), a design structure and a method of manufacturing the IC and, more particularly, to a redundant diffusion barrier structure for interconnect and wiring applications, a design structure and a method of manufacturing the IC.

BACKGROUND

The fabrication of integrated circuits, e.g., microelectronic devices, includes the building of multilevel wiring interconnect regions within the devices. To fabricate such structures, one or more interconnections are formed between first and second level wiring lines. To form these interconnects, openings are formed in the dielectric layer using conventional lithograhic and etching processes. The openings are filled with a metal to form the interconnect. This metal is typically Cu or AlCu. To continue with the build, the above process continues with the deposition of additional interlevel dielectric (ILD) layers to accommodate further processing of the integrated circuit.

The dielectric layers usually consists of a layer of oxide such, for example, as silicon oxides. However, it has been found that Cu metal introduces many integration challenges in combination with the dielectric layers. For example, copper is known to be a fast diffuser through dielectrics, especially in silicon dioxide. This leads to integration difficulty for copper damascene structures. That is, the copper will out diffuse into the dielectric potentially destroying the device. Thus, if copper diffuses from the interconnect wiring into the underlying active electrical devices, then these devices can fail to operate.

In an attempt to solve this problem, a dielectric diffusion barrier is placed in the via or trench prior to the deposition of the copper conductor. The standard industry approach for copper interconnects is to use barrier metals such as titanium nitride (TiN), tantalum (Ta), tantalum nitride (TaN) and/or tungsten nitride (WN) to prevent copper diffusion from the wires. However, it has been found that even a thick layer of such materials or combinations of these materials cannot completely top the out diffusion of copper. This poses a challenging task to designers as technology scales.

Accordingly, there exists a need in the art to overcome the deficiencies and limitations described hereinabove.

SUMMARY

In an aspect of the invention, a structure comprises a first liner lining at least one of a trench and a via and a second liner deposited over the first liner. The second liner comprises RuX. X is at least one of Boron and Phosphorous. The structure comprises a metal deposited on the second liner in the at least one trench and via to form a metal interconnect or wiring.

In another aspect of the invention, a method of fabricating an interconnect or wiring structure comprises depositing a first liner on walls of a trench and via and depositing a second liner on the first liner. The second liner comprises RuX, where X is at least one of Boron and Phosphorous. The method further comprises depositing a metal interconnect or wiring on the second liner.

In a further aspect of the invention, a method of forming a wiring or interconnect structure, comprises: forming at least a trench in a dielectric material; lining the trench with one of TiN, TaN, WN, RuTa(N) and RuN; depositing a redundant liner on the lining, the redundant liner comprising RuX, where X is at least one of Boron and Phosphorous; and depositing Cu or AlCu over the redundant liner to form a metal interconnect or wiring, wherein the redundant liner prevents out diffusing of copper into the dielectric.

In yet a still further aspect of the invention, a design structure is embodied in a machine-readable medium for designing, manufacturing, or testing an integrated circuit. The design structure includes a first liner lining at least one of a trench and a via; a second liner deposited over the first liner, the second liner comprising RuX, where X is at least one of Boron and Phosphorous; and a metal deposited on the second liner in the at least one trench and via to form a metal interconnect or wiring.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The present invention relates to integrated circuits (ICs), a design structure and a method of manufacturing the IC and, more particularly, to a redundant diffusion barrier structure for interconnect and wiring applications, a design structure and a method of manufacturing the IC. In implementation, the present invention provides a redundant diffusion barrier layer to ensure that copper does not out diffuse from metal wiring and interconnect structures. For example, in embodiments, a second (redundant) liner is lined in a trench or via, which is subsequently processed to be a wiring or interconnect structure. This redundant liner acts as a diffusion barrier layer against copper out diffusing into the structure. The second liner may be, for example, Ru(P), Ru(B) or Ru(P, B). This redundant liner provides improved device reliability.

Figure 1:
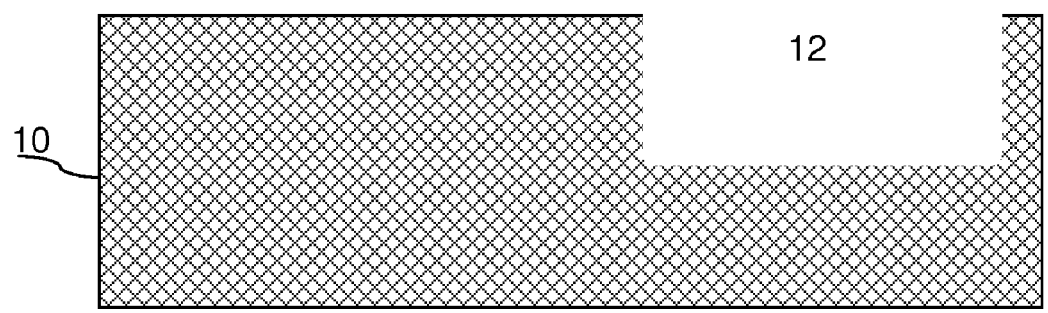
FIGS. 1-7 show fabrication processes and respective structures for manufacturing a structure in accordance with the present invention.

FIG. 1 shows a beginning structure in accordance with the invention. The beginning structure includes a dielectric layer 10. The dielectric layer 10 may be, for example, $SiO_2$, SiCOH, SiLK or other known dielectric materials. The dielectric layer 10 may be either porous or dense, and may be applied by a spin on process or chemical vapor deposition (CVD) process.

A trench 12 is processed in the dielectric layer 10. As should be understood by those of skill in the art, more than one trench can be formed in the dielectric layer 10; however, for ease of discussion only a single trench is discussed herein. The trench 12 may be formed using any conventional lithography and etching process. For example, a mask (not shown) may be applied over the dielectric layer 10 and exposed to light to form openings. A reactive ion etching (RIE) may then be performed to form the trench(es) 12.

Figure 2:
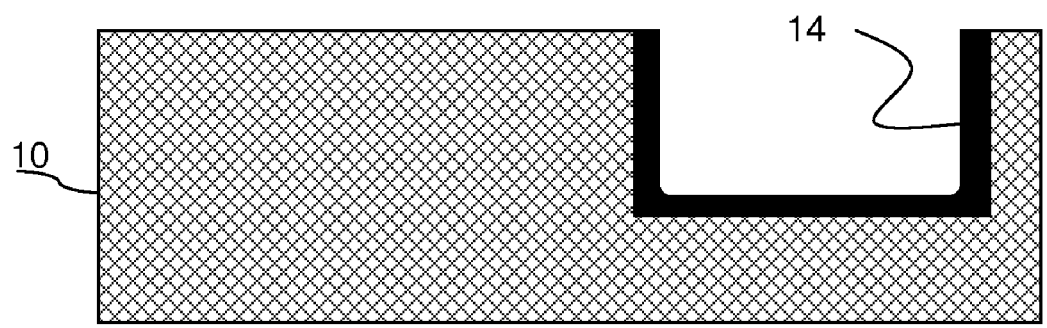

FIG. 2 shows a beginning fabrication process for metallization and chemical mechanical polishing (CMP) processes. More specifically, in FIG. 2 a liner 14 is deposited in the trench 12. The liner 14 may be a barrier layer of TiN, TaN, WN, RuTa(N) or RuN, for example. The deposition process may be a conventional deposition process such as, for example, CVD, physical vapor deposition (PVD) or atomic layer deposition (ALD). In embodiments, the liner 12 can have a thickness of about 10 Å to 200 Å; although other dimensions are contemplated by the invention. As discussed below, a redundant liner (also depicted as reference numeral 14) can be deposited in the trench to act as a redundant barrier.

Figure 3:
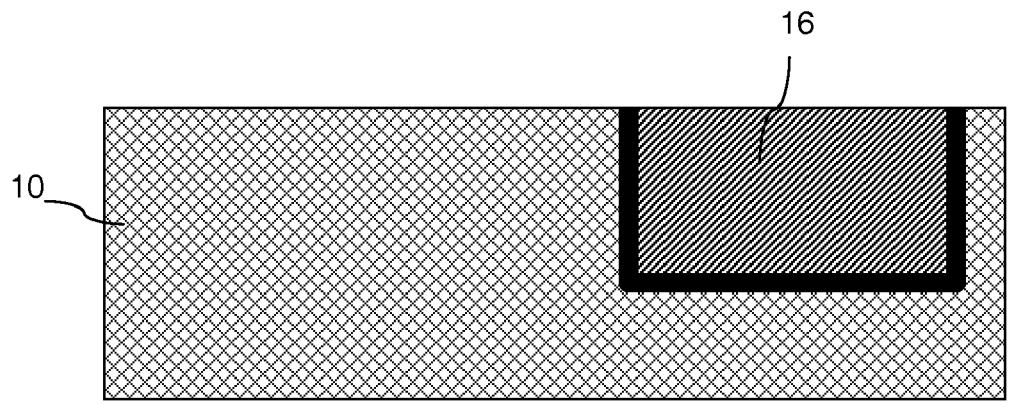

In FIG. 3, a wiring structure 16 such as, for example, Cu or Cu(Al), is deposited over the liner 14. The structure is then planarized using, for example, CMP processes.

Figure 4:
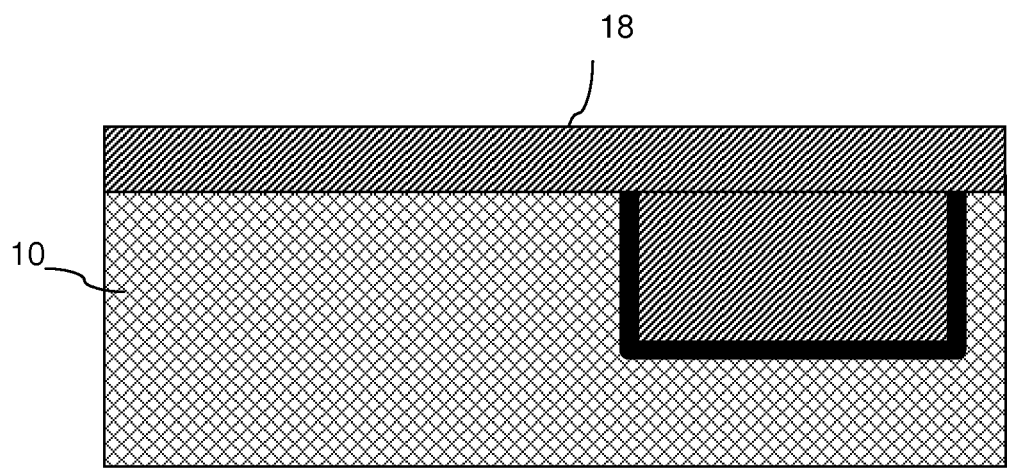

In FIG. 4, a cap 18 is deposited on the structure of FIG. 3. The cap 18 can be, for example, an NBLok, SiC, $Si_4NH_3$ or $SiO_2$. The cap 18 can be deposited using any conventional deposition processes, as discussed herein, and known to those of ordinary skill in the art.

Figure 5:
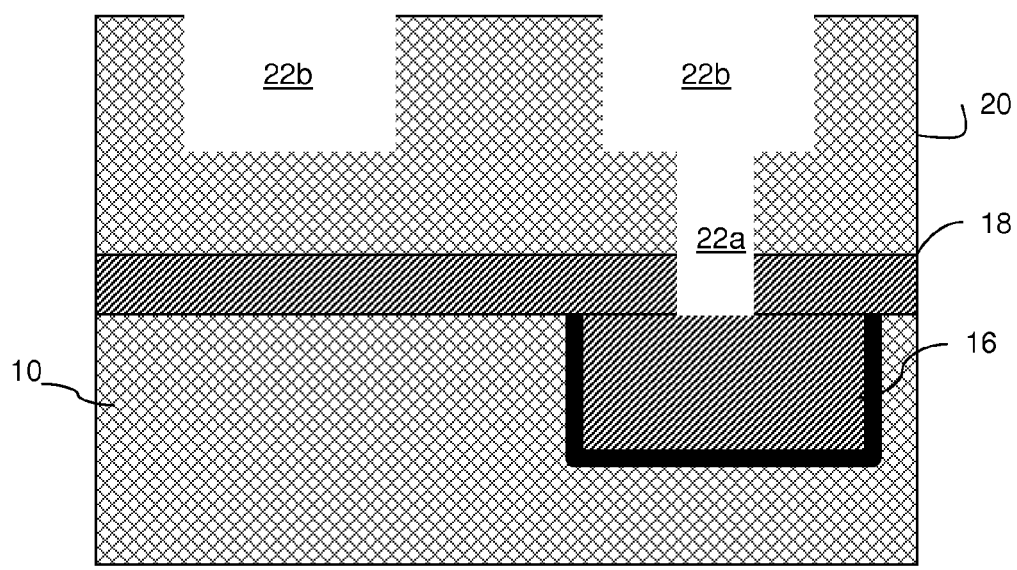
Figure 6:
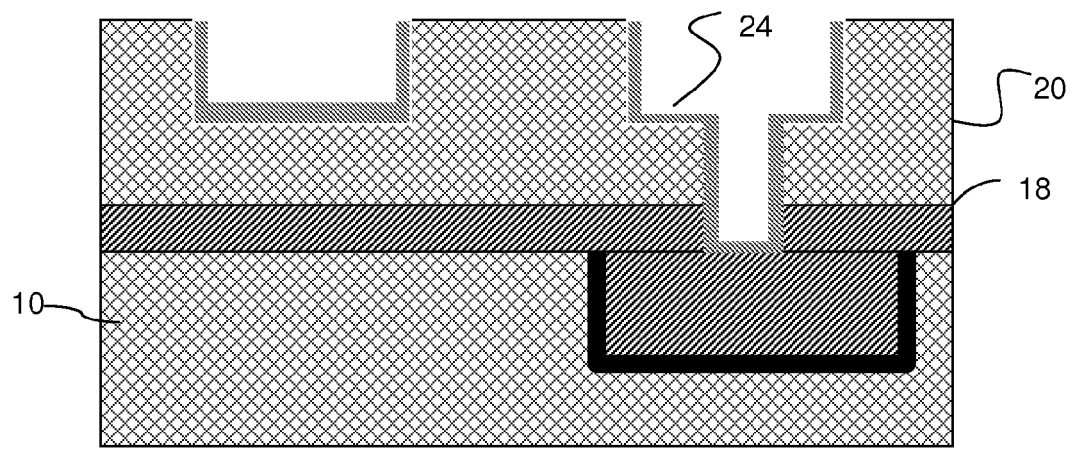

In FIG. 5, a dielectric layer 20 is deposited on the cap 18. The dielectric layer 20 may be, for example, $SiO_2$, SiCOH, SiLK or other known dielectric materials. The dielectric layer 20 may be either porous or dense, and may be applied by a spin on process or chemical vapor deposition (CVD) process.

Still referring to FIG. 5, a via 22a and trenches 22b are formed in the dielectric layer 20 using conventional damascene patterning processes. Those of skill in the art will realize that more than one via and two trenches or any combination thereof may be formed in the structure depending on the specific design parameters. However, for the purposes of discussion only, a single via 22a and two trenches 22b are discussed herein, without providing a limitation to the present invention.

As should be understood by those of skill in the art, the trenches and via may be formed using any conventional lithography and etching process. Illustratively, a mask (not shown) may be applied over the dielectric layer 20 and exposed to light to form openings of a first size for the via 22a. A reactive ion etching (RIE) may then be performed to form the via 22a of the first size. The via 22a extends to the underlying metal wiring layer 16. This process can be repeated to form the trenches 22b of a second, larger size, with such processes being well known in the art that further explanation is not required herein for an understanding of the invention.

As shown in 6, a liner 24 is deposited on the walls of the via 22 and trenches 22b. The liner 24 is a first barrier layer and can be composed of, for example, Ta(N), Ti(N) and W(N). The liner 24 can range in thickness from about 10 Å to 100 Å; although other dimensions are contemplated by the invention. The liner 24 can be deposited using any conventional deposition method, known to those of skill in the art.

Figure 7:
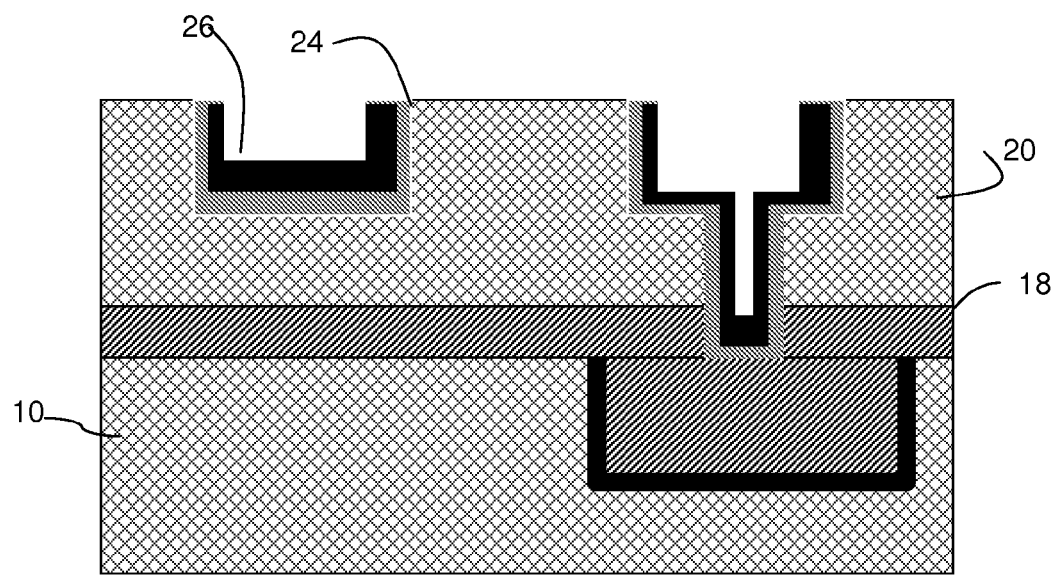

In FIG. 7, a redundant liner 26 is deposited on the liner 24, using conventional deposition processes known to those of skill in the art. The redundant liner 26 can be Ru(P), Ru(B) or Ru(P, B), where the component of (P), (B) or (P) (B) contacts and adjoins the liner 24. The liner 26 can range in thickness from about 10 Å to 100 Å; although other dimensions are contemplated by the invention.

It should be understood by those of skill in the art that the use of Ru alone is not a good diffusion barrier. As such, the copper surface of the interconnect or wiring structure may out diffuse into the dielectric layer 20. However, it has been found that using Ru(P), Ru(B) or Ru(P, B) is a superior diffusion barrier which does not allow the interconnect or wiring material (e.g., copper) to out diffuse into the dielectric. In embodiments, the Ru (P, B) can be a uniform film or have decreasing P, B concentrations. In the latter case, the interface between the liner 24 and liner 26 has the highest B, P concentration, and the surface of the liner 26 can be pure Ru.

Figure 8A:
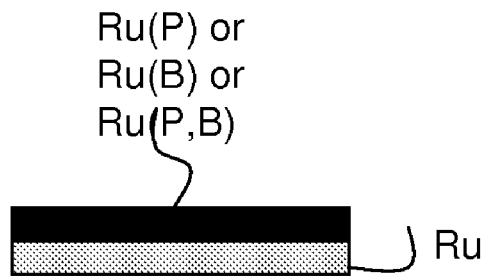
FIGS. 8a-8d shows different lining variants according to aspects of the invention.

FIGS. 8a-8d show different variants of Ru(P), Ru(B) or Ru(P, B) as contemplated by the invention. For example, as shown in FIG. 8a, in aspects of the invention, the liner 26 comprises a top layer of Ru and a bottom layer (i.e., the surface that contacts the liner 24) of Ru(P), Ru(B) or Ru(P, B). In embodiments, the Ru layer and the layer of Ru(P), Ru(B) or Ru(P, B) are each about 20 Å or less and can range from about 10 Å to 20 Å. In further embodiments, the percent concentration of (P), (B) or (P)(B) ranges from about 1% to 30%.

Figure 8B:
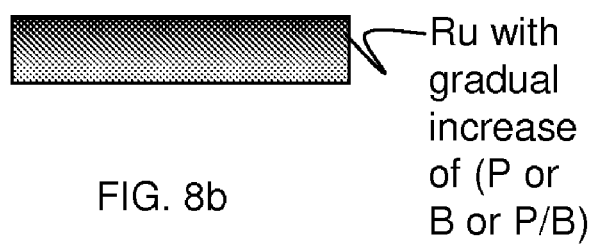

FIG. 8b shows a further aspect of the invention, where the liner 26 is a layer of Ru(P), Ru(B) or Ru(P, B), with the (P), (B) or (P)(B) component gradually decreasing in percentage concentration as it is deposited on the liner 24. For example, in implementation, the (P), (B) or (P)(B) can be introduced during the deposition process by initially having a high gas flow of (P), (B) or (P)(B) such that the bottom portion (e.g., the portion that is closest to the liner 24) of the liner 26 is, for example, 30% of (P), (B) or (P)(B) and then decreasing the gas flow of (P), (B), or (P)(B) such that the upper portion is, for example, about 0% of (P), (B) or (P)(B), with a gradual decrease therebetween. The concentration of (P), (B) or (P)(B) can be increased or decreased by adjusting the gas flow.

Figure 8C:

FIG. 8c shows a further aspect of the invention, where the liner 26 is a single layer of Ru(P), Ru(B) or Ru(P, B), with the (P), (B) or (P)(B) component having a substantially constant percentage concentration throughout the entire liner 26. For example, in implementation, the percentage concentration of (P), (B) or (P)(B) can range from about 1% to 30%, in relation to the entire structure.

Figure 8D:

FIG. 8d shows a further aspect of the invention, where the liner 26 is a layered structure. For example, in one aspect, the layers may alternate from closest to the liner 24 between (i) Ru(P) and Ru, (ii) Ru(B) and Ru, and (iii) Ru(P, B) and Ru. In embodiments, the percentage concentration of (P), (B) or (P)(B) can range from about 0% to 30%, in relation to the entire layered structure. The thickness of the liner 26 can be about 30 Å to 50 Å, with each layer ranging from about less than 10 Å and preferably about 1 Å to 2 Å.

Figure 9:
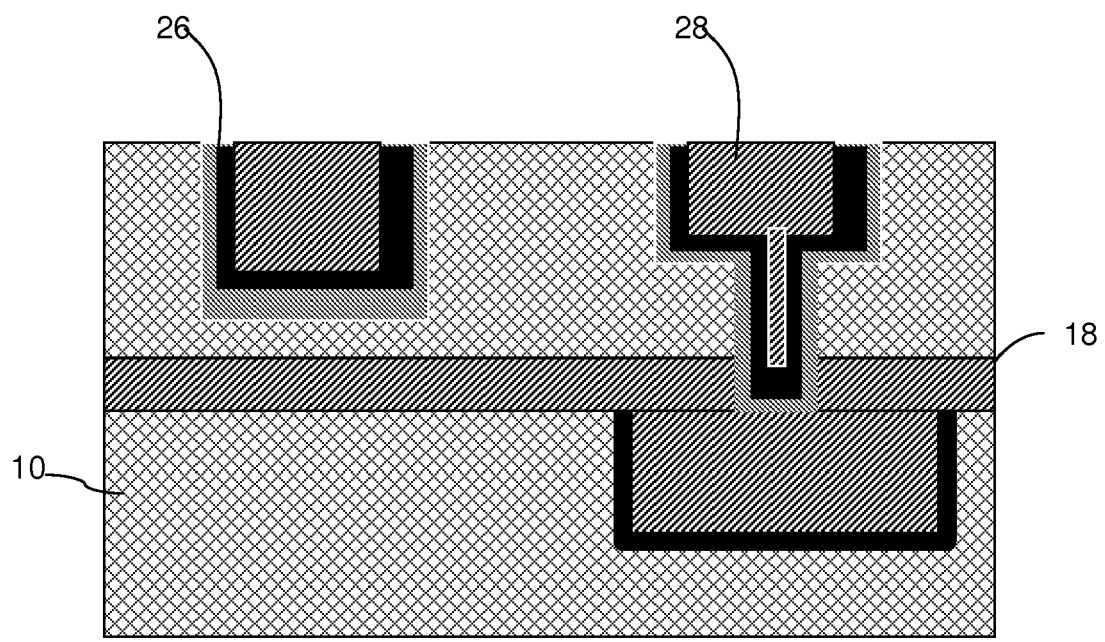
FIG. 9 shows a final structure and respective fabrication processes for manufacturing a structure in accordance with the present invention.

FIG. 9 shows a final structure and respective processing steps in accordance with an aspect of the invention. As shown in FIG. 9, a metal 28 is deposited in the vias and trenches, over the liner 26. The metal 28 can be, for example, Cu or AlCu. The metal 28 can be deposited in a conventional manner as described herein, and can then be planarized using, for example, CMP processes. As should now be understood, the liner 26 of the present invention will prevent out diffusion of copper into the dielectric thereby ensuring device reliability.

DESIGN STRUCTURE

Figure 10:
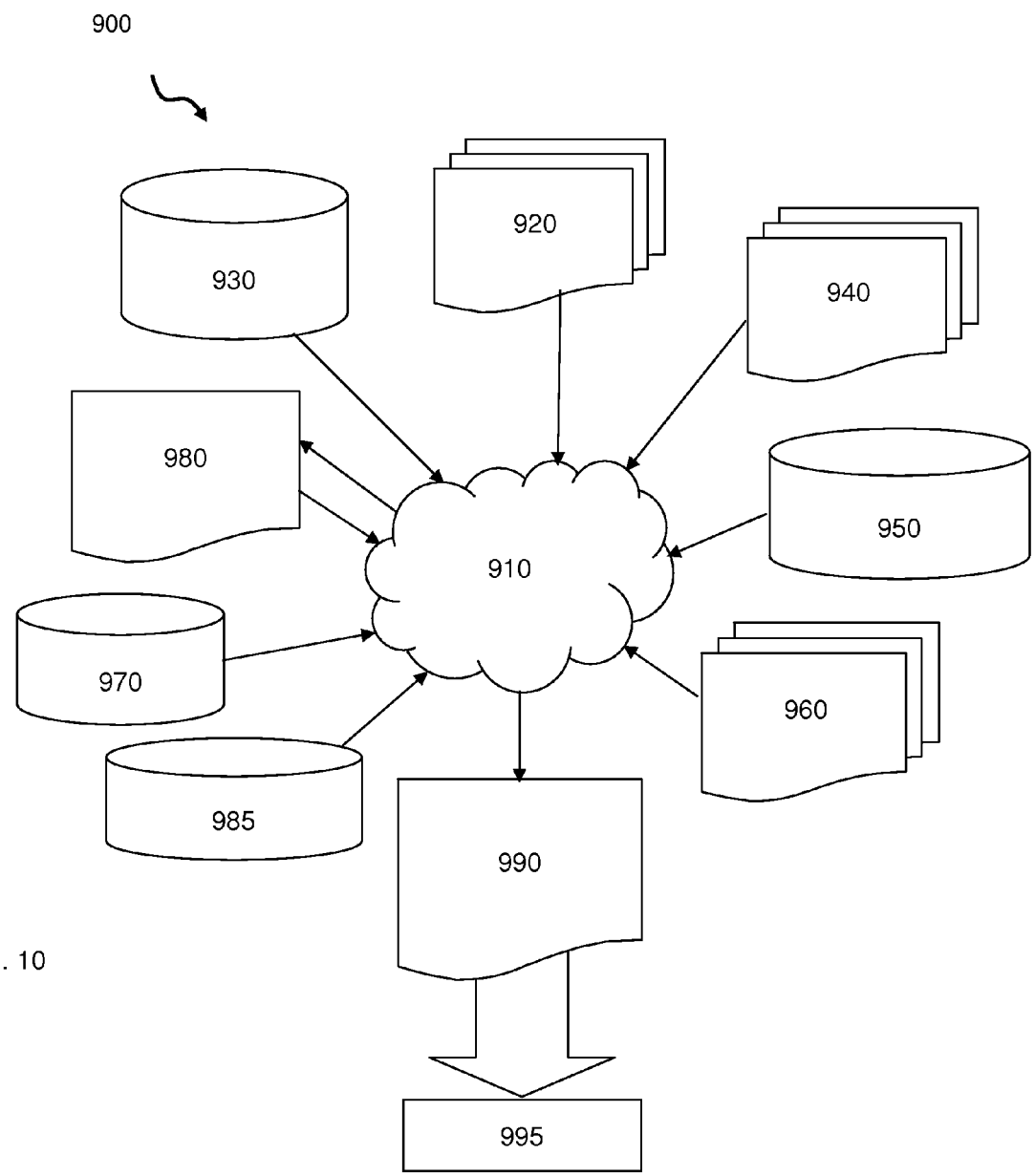
FIG. 10 is a flow diagram of a design process used in semiconductor design, manufacture, and/or test.

FIG. 10 shows a block diagram of an exemplary design flow 900 used for example, in semiconductor IC logic design, simulation, test, layout, and manufacture. Design flow 900 includes processes and mechanisms for processing design structures to generate logically or otherwise functionally equivalent representations of the embodiments of the invention shown in FIGS. 7 and 9. The design structures processed and/or generated by design flow 900 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 7 and 9. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 7 and 9 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include modules for performing standard circuit design processes such as timing analysis, verification, design rule checking, place and route operations, etc.

Design process 910 employs and incorporates well-known logic and physical design tools such as HDL compilers and simulation model build tools to process design structure 920 together with some or all of the depicted supporting data structures to generate a second design structure 990. Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 7 and 9. In one embodiment, design structure 990 may comprise a compiled, executable HDL simulation model that functionally simulates the devices shown in FIGS. 7 and 9.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in FIGS. 7 and 9. Design structure 990 may then proceed to a stage 995 where, for example, design structure 990: proceeds to tape-out, is released to manufacturing, is released to a mask house, is sent to another design house, is sent back to the customer, etc.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A structure comprising:
    a first liner lining at least a bottom surface of at least one of a trench and a via;
    a second liner deposited over the first liner, the second liner comprising RuX, where X is at least one of Boron and Phosphorous; and
    a metal deposited on and directly in contact with the second liner in the at least one of the trench and the via to form a metal interconnect or wiring,
    wherein the second liner comprises a top layer of Ru and a bottom layer of Ru(P), Ru(B) or Ru(P, B), adjacent to the first liner.

2. The structure of claim 1, wherein the bottom layer is in contact with the first liner.

3. The structure of claim 1, wherein a percent concentration of the (P), (B) or (P)(B) ranges from about 1% to 30%.

4. The structure of claim 1, wherein the second liner comprises a mixture of Ru with a component of (P), (B) or (P)(B), with the component of (P), (B) or (P)(B) gradually decreasing in percentage concentration away from the first liner.

5. The structure of claim 1, wherein a top portion of second liner is about 0% of (P), (B) or (P)(B) and a bottom portion which at least partially adjoins with the first liner is about 1% to 30% of (P), (B) or (P)(B), with a gradual decrease therebetween.

6. The structure of claim 1, wherein the second liner comprises a single layer of Ru(P), Ru(B) or Ru(P, B), with the (P), (B) or (P)(B) having a substantially constant percentage concentration throughout the second liner.

7. The structure of claim 6, wherein a percentage concentration of the (P), (B) or (P)(B) ranges from about 1% to 30%.

8. The structure of claim 1, wherein the second liner is a layered structure alternating between one of (i) Ru(P), Ru, Ru(P) and Ru, (ii) Ru(B), Ru, Ru(B) and Ru, or (iii) Ru(P, B), Ru, Ru(P, B) and Ru, where at least a first layer of Ru(B), Ru(P) or Ru(P, B) contacts the first liner.

9. The structure of claim 8, wherein the layered structure has a percentage concentration of (P), (B) or (P)(B) in the range of about 0% to 30%, in relation to the entire layered structure.

10. The structure of claim 1, wherein the via is formed of a first size and extends to an underlying metal wiring layer.

11. The structure of claim 10, wherein the trench is formed of a second size and extends to and is coincident with the via such that a stepped feature is formed.

12. The structure of claim 11, wherein another trench is formed remotely from the trench and the via.

13. The structure of claim 11, wherein the stepped feature is lined with the first liner and the second liner.

14. The structure of claim 13, wherein the via extends through a cap which is directly over and in contact with the underlying metal wiring layer.

15. The structure of claim 12, further comprising a cap over the underlying metal wiring layer, wherein the another trench is above the cap.

16. The structure of claim 15, wherein the first liner lines at least a bottom surface of the another trench.

* * * * *